United States Patent [19]

Ootani

[11] Patent Number: 4,959,562
[45] Date of Patent: Sep. 25, 1990

[54] ERROR PREVENTION CIRCUIT WITH CAPACITIVE MEANS

[75] Inventor: Takayuki Ootani, Tokyo, Japan

[73] Assignee: Kabushiki Kaisha Toshiba, Kawasaki, Japan

[21] Appl. No.: 325,186

[22] Filed: Mar. 17, 1989

[30] Foreign Application Priority Data

Mar. 18, 1988 [JP] Japan .................................. 63-63462

[51] Int. Cl.⁵ ........................ H03K 17/16; H03K 3/01; H03K 19/094
[52] U.S. Cl. ..................................... 307/443; 307/451; 307/491; 307/542; 307/546; 307/572; 307/262; 307/296.4; 307/286.5
[58] Field of Search ............. 307/401, 296.4, 6, 296.8, 307/262, 443, 448, 451, 510, 542, 546, 572

[56] References Cited

U.S. PATENT DOCUMENTS 4,290,119  9/1981  Masuda et al. .................... 307/296.4
4,833,341  5/1989  Watanabe et al. .................. 307/491

OTHER PUBLICATIONS

Wada T. et al., "A 34ns 1MB CMOS SRAM Using Triple Poly", ISSCC Digest of Technical Papers, pp. 262, 263; Feb., 1987.
U.S. Patent Appln. Ser. No. 07/320,741 filed 3/8/89.

Primary Examiner—Stanley D. Miller
Assistant Examiner—Margaret R. Wambach
Attorney, Agent, or Firm—Finnegan, Henderson, Farabow, Garrett, and Dunner

[57] ABSTRACT

A semiconductor integrated circuit equipped with an input buffer operation error prevention circuit is disclosed which comprises a data output signal level transition detector circuit for detecting at least one of a variation from a low level from a high level and a variation from a high level to a low level of a signal of a circuit of a stage preceding an output buffer and for generating a clock pulse and an input buffer signal terminal control circuit for controlling the terminal level of a first stage gate in an input buffer through the use of a clock pulse so as to cancel a fall in an input level detection margin of the input buffer which is caused when the output data of the output buffer varies from a "0" level to a "1" level and vice versa.

19 Claims, 10 Drawing Sheets

F I G. 1

F I G. 2

FIG. 3A D_OUT

FIG. 3D INPUT SIGNAL

FIG. 3E NODE A

F I G. 4

F I G. 5A

F I G. 5B

F I G. 6A

F I G. 6B

F I G. 7A

F I G. 7B

FIG. 8A NODE B

FIG. 8B NODE C

FIG. 8C $\phi_{ROUT}$

FIG. 8D $\phi_{FOUT}$

FIG. 8E $\phi_N$

FIG. 8F $\phi_P$

FIG. 8G $D_{OUT}$

FIG. 8J INPUT SIGNAL

FIG. 8K NODE A

F I G. 9

FIG. 10A NODE B

FIG. 10B NODE C

FIG. 10C $\phi_{ROUT}$

FIG. 10D $\phi_{FOUT}$

FIG. 10E $\phi_N$

FIG. 10F $\phi_P$

FIG. 10G DOUT

FIG. 10J INPUT SIGNAL

FIG. 10K NODE A

F I G. 11

FIG. 12A NODE B

FIG. 12B NODE C

FIG. 12C φROUT

FIG. 12D φFOUT

FIG. 12G DOUT

FIG. 12H VDD

FIG. 12I VSS

FIG. 12J INPUT SIGNAL

FIG. 12K NODE A

F I G. 13

ERROR PREVENTION CIRCUIT WITH CAPACITIVE MEANS

BACKGROUND OF THE INVENTION

1. Field of the Invention

The present invention relates to a semiconductor integrated circuit having an input buffer operation error preventing circuit for preventing an input signal level error detection operation at an input buffer which is caused by an output noise upon a variation in the output data of an output buffer.

2. Description of the Related Art

In a semiconductor integrated circuit, if in order to obtain a high-speed access time the drive power of a data output buffer is increased to allow a high-speed rise and fall in an output data signal, then a noise signal is generated in a power supply line (including a ground line) due to a temporary large current through the output buffer. In this case, the output noise induces an input level detection error at, for example, a signal input buffer, causing a problem as will be set forth below.

Figure 1:
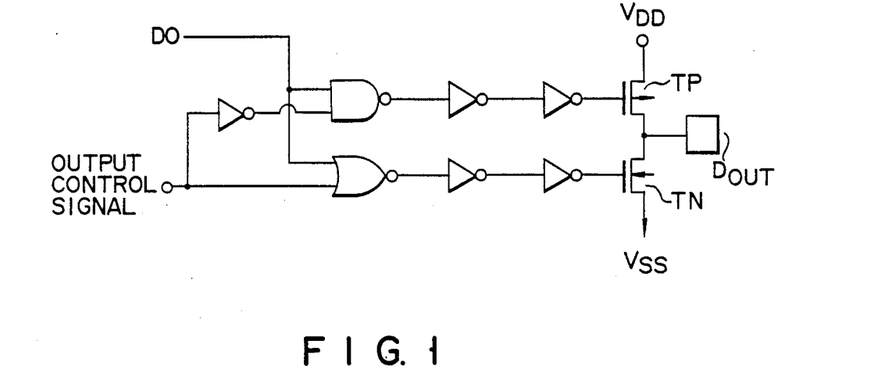
FIG. 1 shows an output buffer and output control circuit for explaining an input signal level detection error at an input buffer upon a variation in the output data of an output buffer in a semiconductor integrated circuit.
Figure 2:
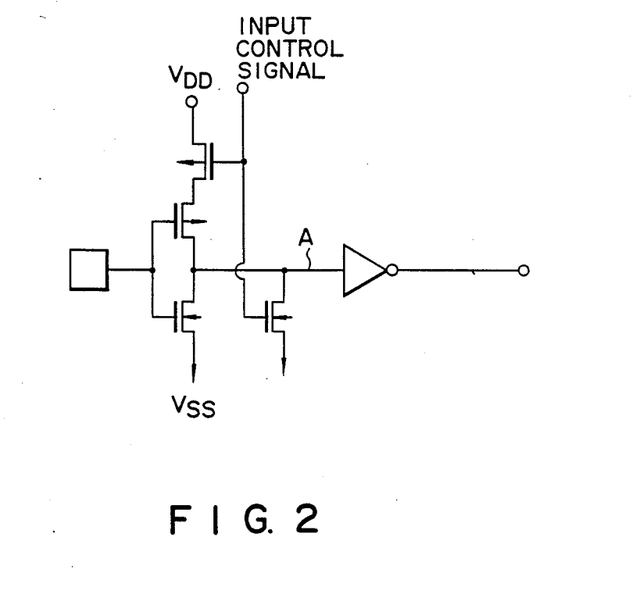
FIG. 2 is a circuit diagram showing an input buffer referred to in the description of the semiconductor integrated circuit of FIG. 1.
Figure 3A:
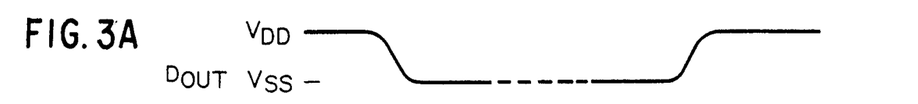
FIGS. 3A-3E are timing diagrams showing an input level detection error operation of a TTL input signal to an input buffer shown in FIG. 2 which is caused upon a variation in the output data of the output buffer in the semiconductor integrated circuit.
Figure 3B:
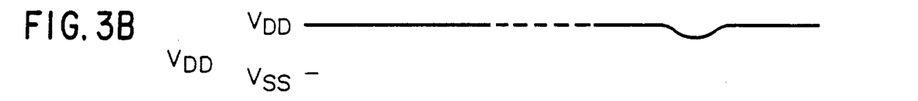
Figure 3C:
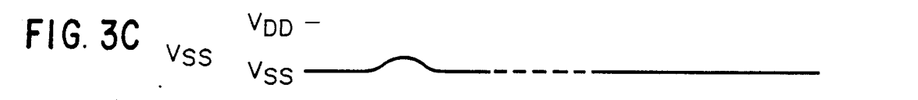
Figures 3D, 3E:
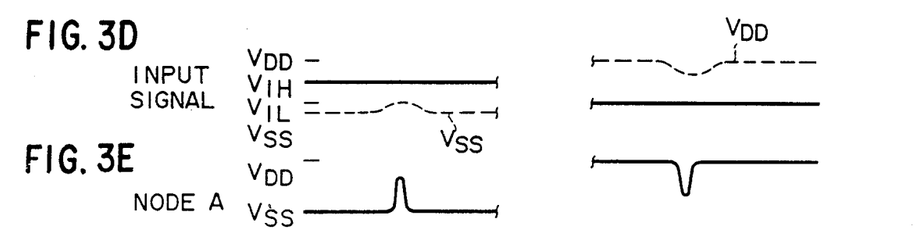

FIGS. 1 and 2 show an output buffer and input buffer, respectively, and FIGS. 3A-3E shows the state of a typical error detection operation of the input buffer at the time when the output data of the output buffer varies. That is, at a "0" level output of the output buffer, a noise signal is induced on a $V_{SS}$ line (a ground line) due to a drive peak current of an N-channel transistor TN in the output buffer, resulting in a potential variation. At this time, if in the input buffer an input signal of a TTL (transistor-transistor logic) level is a high level and there is a small margin in the input signal level, an input buffer of a first stage temporarily assumes the same state as upon receipt of a TTL input signal of a low level, due to the influence of a noise signal of a "$V_{SS}$ potential" level, causing an output node A of a first stage in the input buffer to go high temporarily. On the other hand, at a "1" output level of the output buffer, a noise signal is induced on the $V_{DD}$ power supply by a drive peak current of a P-channel transistor TP in the output buffer. If, at this time, the TTL input signal is at a low level in the input buffer and there is a small margin in that input signal level, the input buffer of the first stage temporarily assumes the same state as upon receipt of a TTL input signal of a high level, due to the influence of a noise signal of a "$V_{DD}$" potential level, causing the output node A of the first stage in the input buffer to go low temporarily.

In order to prevent the aforementioned problem, that is, prevent an operation error of the input buffer resulting from the output noise upon a variation in the output data, the usual practice is to reduce the drive power of the output buffer and hence to reduce an amount of output noise generated or, in a memory of a multi-bit structure, to reduce an amount of output noise generated, by displacing each bit output a corresponding time little by little. These methods present a problem because they are used at the sacrifice of data read-out speed. Another method is, prior to the varying of an input at an output buffer, shorting input and output terminals of a final stage of the output buffer so that, with the output waveform made less sharp, an output noise component may be reduced. For this method, reference is made to Wada, T., et al., "A 34ns 1Mb CMOS SRAM using Triple Poly", ISSCC DIGEST OF TECHNICAL PAPERS, pp 262 to 263; Feb., 1987. According to this method, the input and output terminals of the output buffer are forced into conduction, offering a risk of inducing a large current therethrough or rather inducing a power supply potential variation. Furthermore, there is also a risk that the aforementioned conduction operation will be performed at the sacrifice of data read-out speed.

SUMMARY OF THE INVENTION

It is accordingly the object of the present invention to provide a semiconductor integrated circuit having an input buffer operation error preventing circuit, which, without the sacrifice of any data read-out speed, can prevent any input buffer error caused upon an output noise due to a variation in output data which would otherwise be involved in a conventional semiconductor integrated circuit.

According to the present invention, a semiconductor integrated circuit equipped with an input buffer operation error preventing circuit comprises a data signal level transition detector for detecting at least one of a variation from a low level to a high level and that from a high level to a low level of a signal of a circuit of a stage preceding an output buffer and for generating a clock pulse and an input buffer terminal control circuit for controllably adding a capacitor to an input terminal or output terminal of a first stage gate in an input buffer through the use of the clock pulse generated by the data output signal level transition detector circuit so as to cancel a fall in an input level detection margin of the input buffer which is caused when the output data of the output buffer varies from a "0" level to "1" level and vice versa.

According to the semiconductor integrated circuit having an input buffer's error operation preventing circuit, when an input level detection margin of the input buffer is decreased by a variation of the power supply potential caused by output noise variation in the output data of the output buffer, a capacitor is added to the input or output terminal of the first stage gate of the input buffer, thereby preventing the logical level of the input signal from being erroneously detected.

BRIEF DESCRIPTION OF THE DRAWINGS

FIGS. 12Aa–12K are timing diagrams showing the operation of the semiconductor integrated circuit of FIG. 11.

DETAILED DESCRIPTION OF THE PREFERRED EMBODIMENT

The semiconductor integrated circuit according to the embodiments of the present invention will be explained below with reference to the accompanying drawings.

Figure 4:
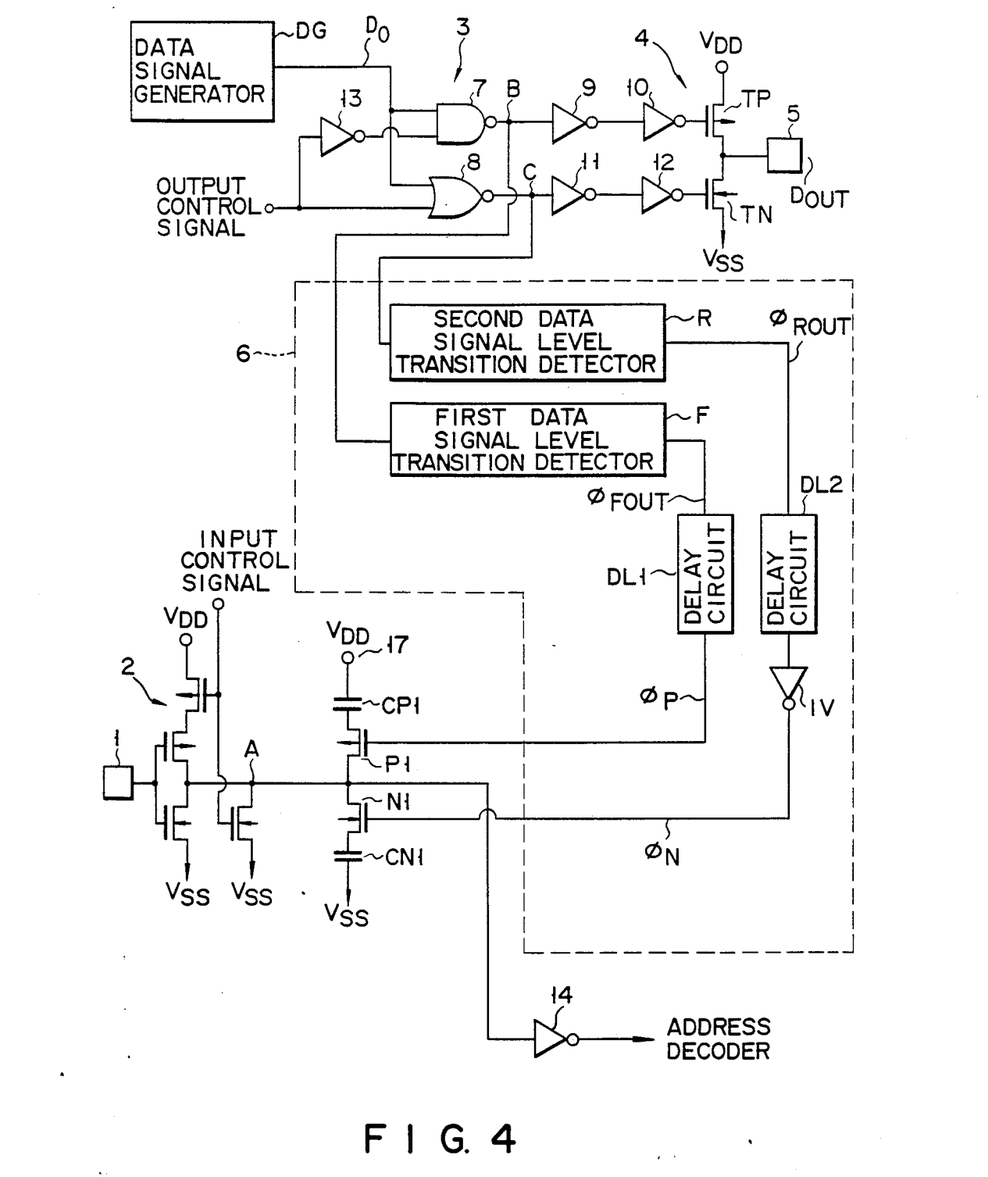
FIG. 4 is a circuit diagram showing a semiconductor integrated circuit according to an embodiment of the present invention which includes an input buffer operation error preventing circuit.

In the semiconductor memory integrated circuit shown in FIG. 4, reference numeral 1 shows an address input pad; 2, an input buffer; 3, an output control circuit; 4, an output buffer; 5, a data output pad and 6, an operation error presenting circuit, noting that DG shows a data signal generator and that $V_{DD}$ and $V_{SS}$ represent a power supply potential and reference potential (ground potential), respectively. The input buffer 2 comprises CMOS type two-input NOR gates with one input supplied with a TTL level input signal coming from an external source via an input pad 1 and with the other input supplied with a chip-enable "0" level input control signal. The output control circuit 3 comprises a NAND gate 7 and NOR gate 8 supplied at one terminal with data output signal $D_O$ coming from the data signal generator DG, series circuit of CMOS inverters 9 and 10 connected to the output of the NAND gate 7, series circuit of CMOS inverters 11 and 12 connected to the output of the NOR gate 8, and CMOS inverter 13 for supplying a "0" level output control signal at a read time and "1" level output control signal at a write time to the other input to the NAND gate 7 in an inverted fashion, the output control signal being supplied to the other terminal of the NOR gate 8. A series circuit of a p channel transistor TP and N channel transistor TN is connected between the power supply line $V_{DD}$ and the ground terminal $V_{SS}$, and common junction of the drains of the transistors TP and TN is connected to a data output pad 5.

An operation error preventing circuit 6 comprises first data signal level transition detector F and second data signal level transition detector R for detecting signal level transition on output nodes B and C of a preceding circuit (for example, the NAND gate 7 and NOR gate 8 in the output control circuit 3) of the output buffer 4, delay circuit DL1 connected in series to the output of the first detector F, a series circuit of a delay circuit DL2 and CMOS inverter IV connected to the output of the second detector R. An input buffer signal terminal control circuit 17 comprises a series circuit of a capacitor CP1 and a P channel transistor P1 connected across the power supply terminal $V_{DD}$ and the output terminal A of the input buffer 2 and series circuit of an N channel transistor N1 and a capacitor CN1 connected across the output terminal A and ground terminal $V_{SS}$. An output $\phi_p$ of the delay circuit DL1 and output $\phi_N$ of the inverter IV are supplied to the gates of the P channel transistor P1 and the N channel transistor N1 in the control circuit 17 respectively.

Figure 5A:
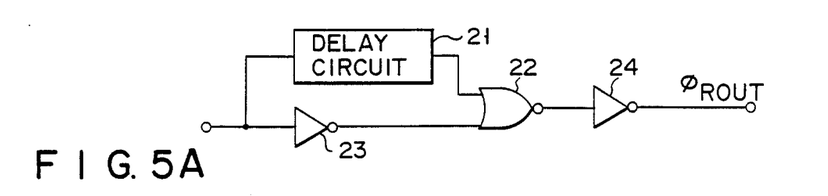
FIG. 5A is a circuit diagram showing a second data signal level transition detector in the semiconductor integrated circuit and FIG. 5B shows another second data signal level transition detector in the semiconductor integrated circuit of FIG. 4.
Figure 5B:
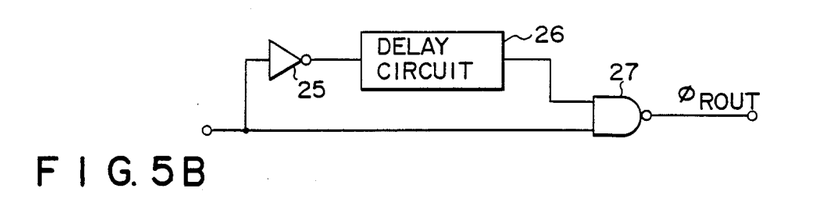

The detector R detects the time of a transition in the data output signal of the data signal generator DG, that is, a time immediately preceding a variation of the N channel transistor TN from OFF to ON (immediately preceding a variation of the ground potential $V_{SS}$) and generates a "0" level clock pulse $\phi_{Rout}$. The second data signal level transition detector R is of such a type as shown, for example, in FIG. 5A or 5B. That is, in the circuit shown in FIG. 5A, a data output signal to the second detector R is supplied to one input of a NOR gate 22 via a delay circuit 21 and to the other input of the NOR gate 22 via an inverter 23 and output of the NOR gate 22 is inverted by an inverter 24 to generate a clock pulse $\phi_{ROUT}$. In the circuit shown in FIG. 5B, an input signal is supplied to one input of a NAND gate 27 via a series circuit of an inverter 25 and delay circuit 26 and directly to the other input of the NAND gate 27. The output of the NAND gate 27 is output as a clock pulse $\phi_{ROUT}$.

Figure 6A:
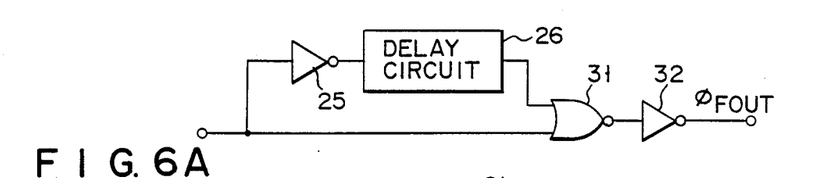
FIG. 6A shows a first data signal level transition detector in the semiconductor integrated circuit of FIG.
Figure 6B:
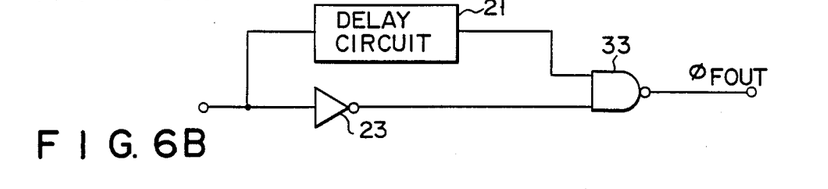
FIG. 6B shows another variant of the second data signal level transition detector of FIG. 4.

The first data signal level transition detector F detects the time of a transition in the data output signal of the data signal generator DG, that is, a time immediately preceding a variation of a p channel transistor TP of the output buffer 4 from OFF to ON in this case (immediately preceding a variation of the power supply potential $V_{DD}$) and generates a "0" level clock pulse $\phi_{FOUT}$. The circuit F is of such a type as shown, for example, in FIG. 6A or 6B. That is, the circuit of FIG. 6A is the same as that of FIG. 5B except that a series circuit of a NOR gate 31 and inverter 32 is connected in place of the aforementioned NAND gate 27. The circuit of FIG. 6B is the same as that of FIG. 5A except that a NAND gate 33 is used in place of the aforementioned series circuit of the NOR gate 22 and inverter 24.

Figure 7A:
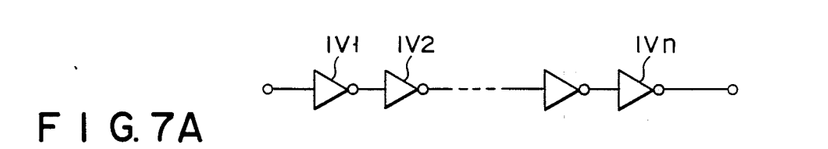
FIG. 7A shows a delay circuit as shown in FIGS. 5A, 5B, 6A and 6B
Figure 7B:
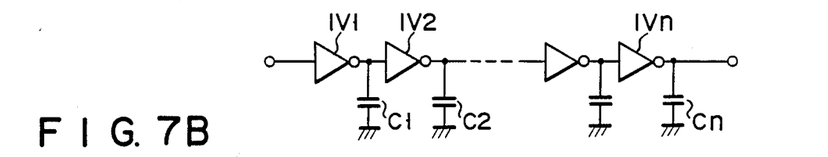
FIG. 7B shows another variant of the delay circuit as shown in FIGS. 5A, 5B, 6A and 6B.
Figure 8A:
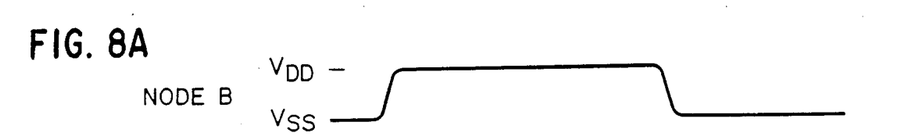
FIGS. 8A–8K are timing diagrams of the semiconductor integrated circuit having an input buffer operation error preventing circuit of FIG. 4.
Figure 8B:
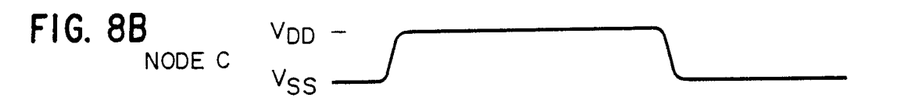
Figure 8C:
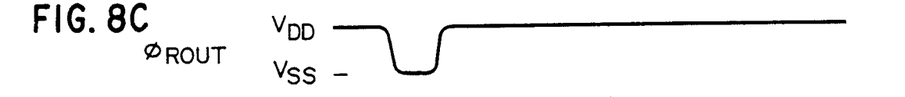
Figure 8D:
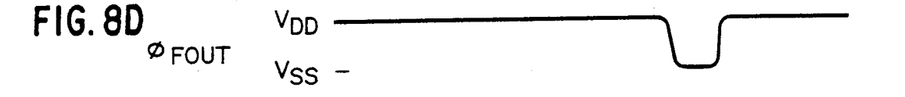
Figure 8E:
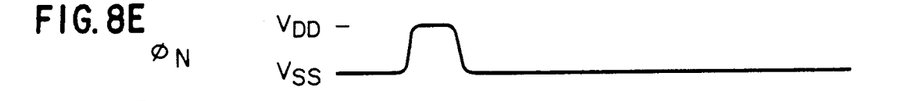
Figure 8F:
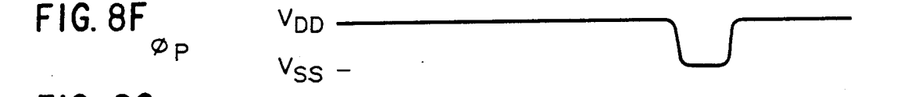
Figure 8G:
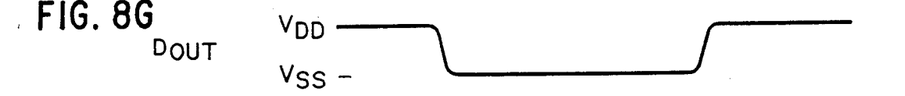
Figure 8H:
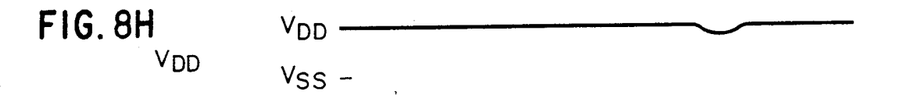
Figure 8I:
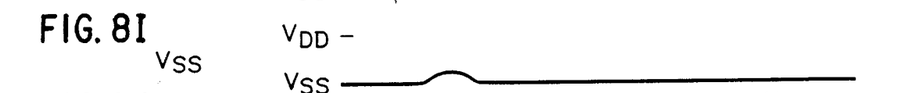
Figure 8J:
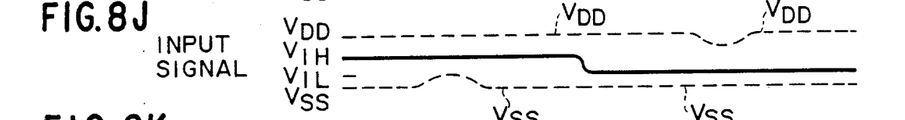
Figure 8K:
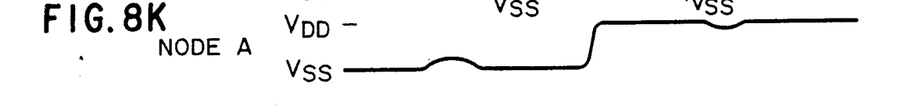

The delay circuits 21 and 26 as shown in FIGS. 5A, 5B, 6A and 6B comprise an even number of series-connected inverters IV1, ..., IVn and capacitors C1, ..., Cn with each output connected relative to the ground terminal, as shown in FIGS. 7A or 7B, as required.

The delay circuits DL1 and DL2 are of such a type as shown, for example, in FIGS. 7A and 7B. The delay circuits DL1 and DL2 delay the aforementioned clock pulses $\phi_{FOUT}$ and $\phi_{ROUT}$ by a predetermined time and adjust the switching operation timing of the P channel transistor P1 and N channel transistor N1.

The series circuit of the capacitor CP1 and P channel transistor P1 and N channel transistor N1 and capacitor CN1 controllably add the capacitor CN1 or the capacitor CP1 to the output terminal A of the input buffer 2 in a direction toward cancelling a fall in the input level detection margin of the input buffer 2 which is caused by an output noise (power supply potential variation) upon a variation in the output data of the output buffer 4 from "0" to "1" and from "1" to "0".

The output signal of the input buffer 2 is input to an address decoder via an inverter 14.

Referring to the voltage waveform of FIGS. 8A–8K, an explanation of the operation of the semiconductor integrated circuit will be set forth below in connection with preventing an input buffer operation error at the time of a variation in the data output of the output buffer. That is, upon a "0" read operation of the output buffer 4, for example, the node C of the output control circuit 3 varies from a low level to a high level and hence the second data signal level transition detector R generates a "0" level clock pulse $\phi_{ROUT}$. The clock pulse $\phi_{ROUT}$ has its timing adjusted past the delay circuit DL2 and inverter IV, generating a "1" level clock pulse $\phi_N$. The clock pulse $\phi_N$ is supplied to the gate of the N channel transistor N1. If, at this time, the TTL level input signal of the input buffer 2 is at a low level, no problem arises. If, on the other hand, the TTL level input signal is at a high level VIH and there is less detection margin, there is a risk that a detection error operation will occur. At this time, the N channel transistor N1 is temporarily turned ON by a clock pulse $\phi_N$ and, due to the capacitor CN1 added between the output terminal A of the input buffer 2 and the ground terminal, a potential on the output terminal A is lowered to the ground potential side, an operation which tends to cause the output terminal A to vary to a high level side is made less active, failing to cause a potential on the output terminal A of the input buffer 2 to go high temporarily. It is thus possible to improve a detection margin against a high level VIH of the TTL level input signal.

If, on the other hand, a "1" data is read out of the output buffer 4, a potential on the node B of the output control circuit 3 varies from the high level to the low level and hence a "0" level clock pulse $\phi_{FOUT}$ is produced from the first data signal level transition detector F. The clock pulse $\phi_{FOUT}$ has its timing adjusted past the delay circuit DL1 to generate a clock pulse $\phi_P$. The clock pulse $\phi_P$ is supplied to the gate of the P channel transistor P1. If, at this time, the TTL level input signal of the input buffer 2 is at a high level, no problem is encountered because there is an adequate detection margin. If, however, a TTL level input signal is at a low level VIL and there is less detection margin, there is a risk that the aforementioned detection error will occur. In this embodiment, the P channel transistor P1 is rendered ON temporarily and, due to a capacitance CP1 between the output terminal A of the input buffer 2 and the power supply terminal, the potential level on the output terminal A is raised, causing an operation which tends to cause the output terminal A to vary to a low level side. As a result, the situation under which the potential on the output terminal A of the input buffer 2 goes low temporarily is avoided, increasing a detection margin against the low level VIL of the TTL level input signal.

The present invention is not restricted to the aforementioned embodiment and can be changed or modified in various ways without departing from the spirit and scope of the present invention. For example, the p channel transistor P1 and capacitor CP1, as well as the N channel transistor N1 and capacitor CN1, may be rearranged in a proper fashion.

Figure 9:
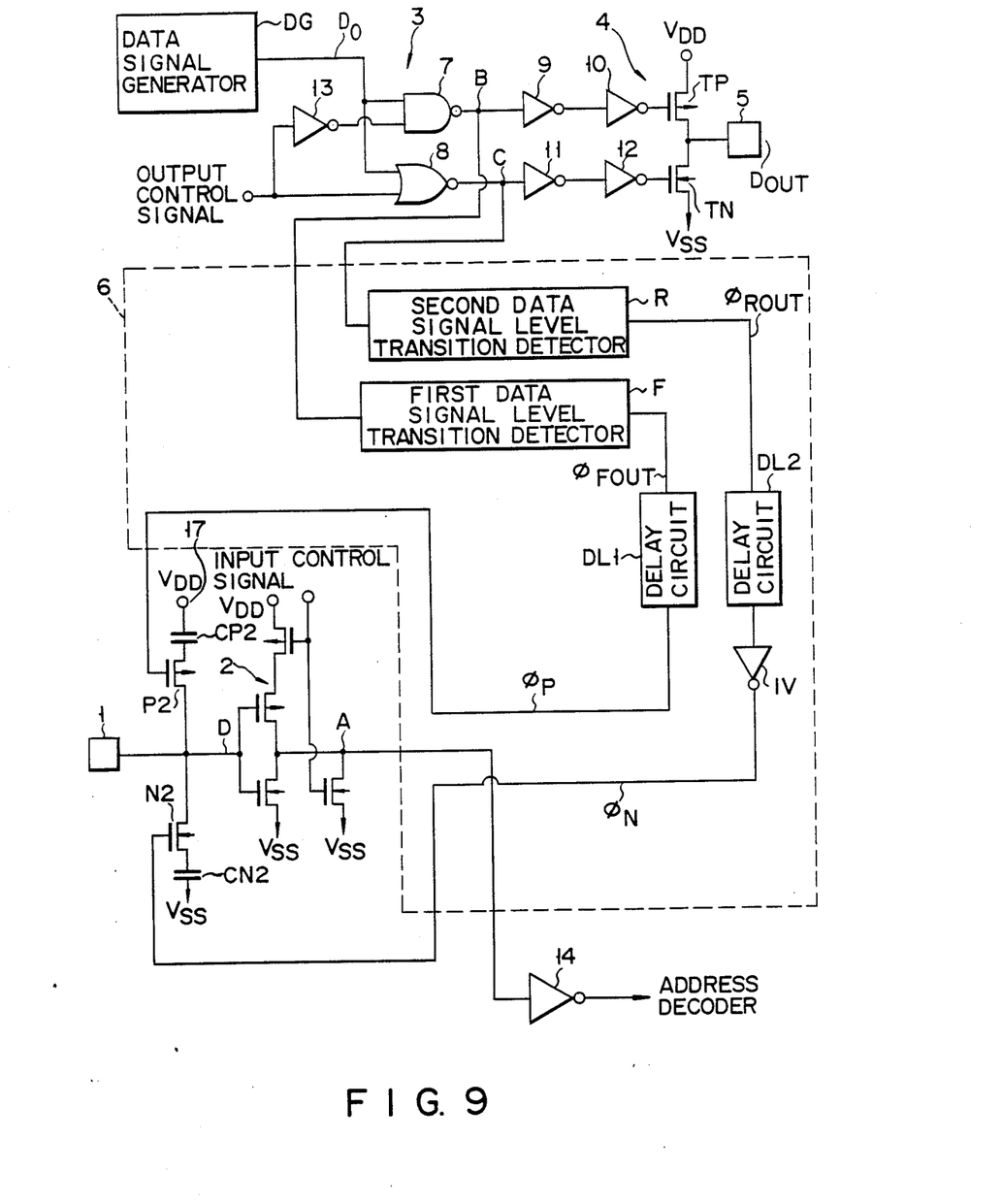
FIG. 9 shows a semiconductor integrated circuit according to another embodiment of the present invention, including an input buffer operation error preventing circuit.
Figure 10A:
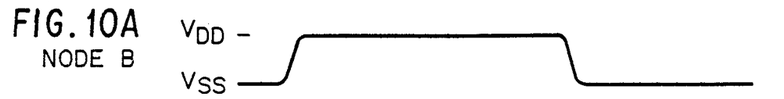
FIGS. 10A–10K are timing diagrams showing the operation of the semiconductor integrated circuit of FIG. 9.
Figure 10B:
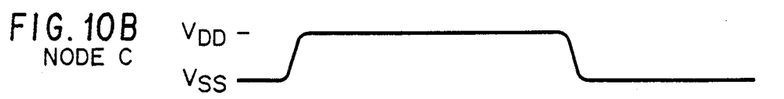
Figure 10C:
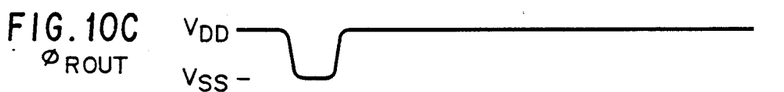
Figure 10D:
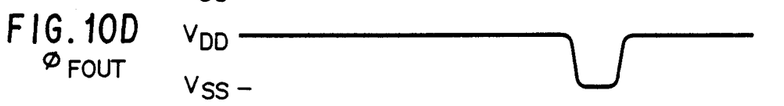
Figure 10E:
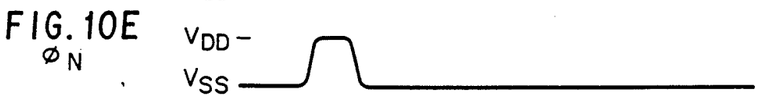
Figure 10F:
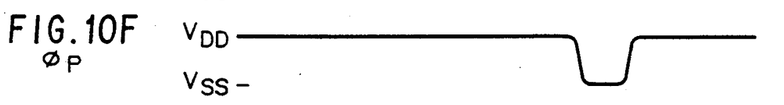
Figure 10G:
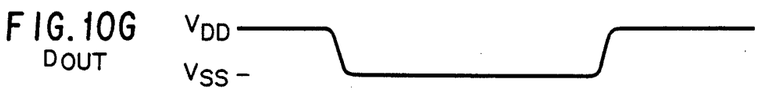
Figure 10H:
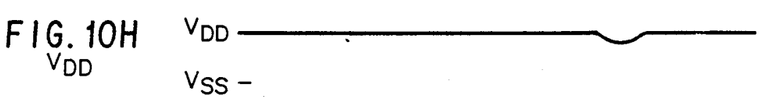
Figure 10I:
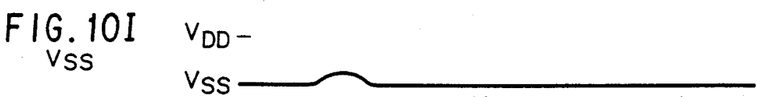
Figure 10J:
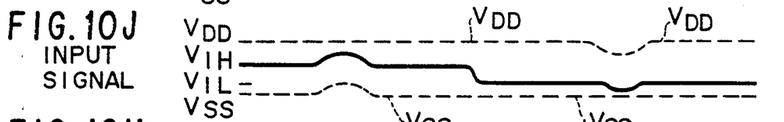
Figure 10K:
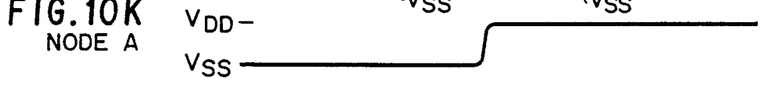

As shown in FIG. 9, in place of an output terminal A of an input buffer 2, a capacitor CP2 and a P channel transistor P2 are connected between an input terminal D of an input buffer 2 and a power supply terminal $V_{DD}$ and a capacitor CN2 and an N channel transistor N2 are connected between the input terminal D and a power supply terminal $V_{SS}$, a clock pulse $\phi_P$ being supplied to the gate of the P channel transistor P2 and clock pulse $\phi_N$ being supplied to the gate of the N channel transistor N2.

The operation error preventing operation is performed s in a manner similar to that as set forth above, the waveforms of the operation being shown in FIGS. 10A–10K. If the N channel transistor N2 is turned ON with the presence of the capacitor CN2, an input signal level on the input terminal D is raised together with a level on the power supply terminal $V_{SS}$ and hence a VIH detection margin is improved. If the P channel transistor P2 is turned ON with the presence of the capacitor CP2, an input signal level on the input terminal D is lowered together with a level on the power supply terminal $V_{DD}$, increasing a VIL detection margin.

Figure 11:
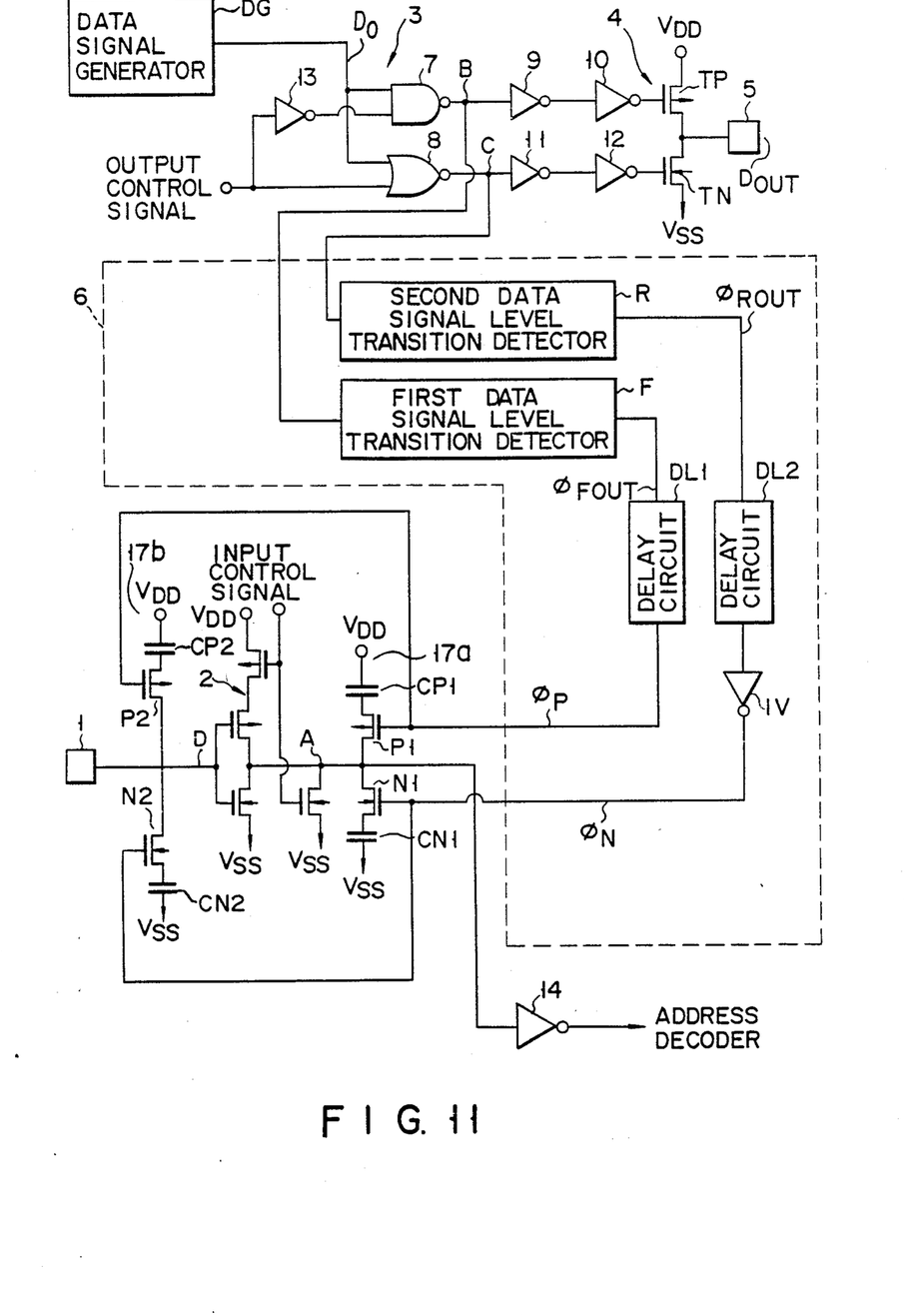
FIG. 11 shows a semiconductor integrated circuit according to another embodiment of the present invention, including an input buffer operation error preventing circuit.
Figure 12A:
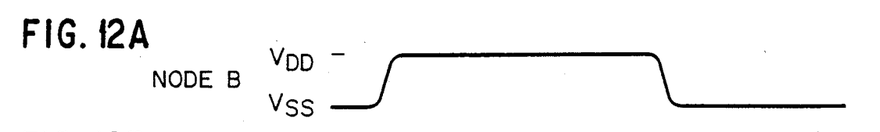
Figure 12B:
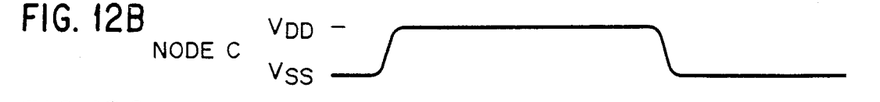
Figure 12C:
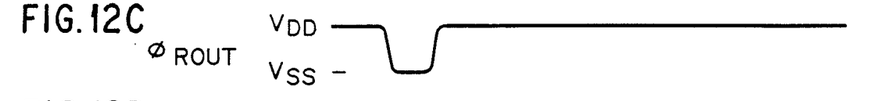
Figure 12D:
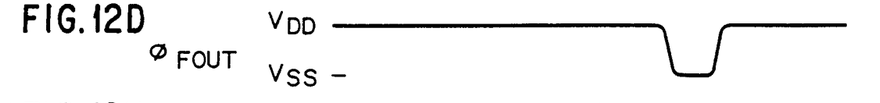
Figure 12E:
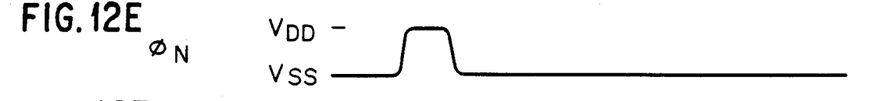
Figure 12F:
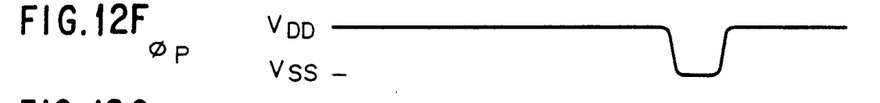
Figure 12G:
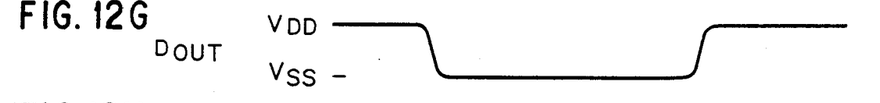
Figure 12H:
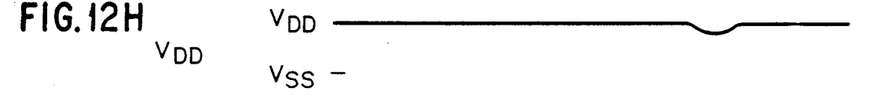
Figures 12I, 12J, 12K:
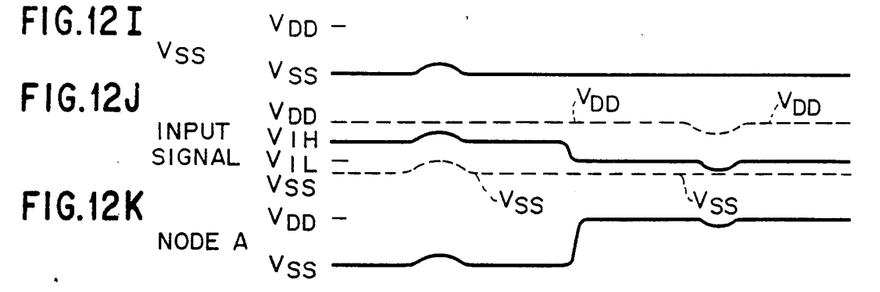

An embodiment of FIG. 11, a combination of the embodiments shown in FIGS. 4 and 9, is of such a type that, as shown in FIG. 11, transistors P1, N1 and capacitors CP1, CN1 are provided on the output terminal A side of an input buffer 2 and transistor P2, N2 and capacitors CP2, CN2 are provided on the input terminal D side of the input buffer 2. This embodiment can obtain the same advantage as those of the aforementioned embodiments, noting that the waveform of respective parts are shown in FIGS. 12A–12K.

Figure 13:
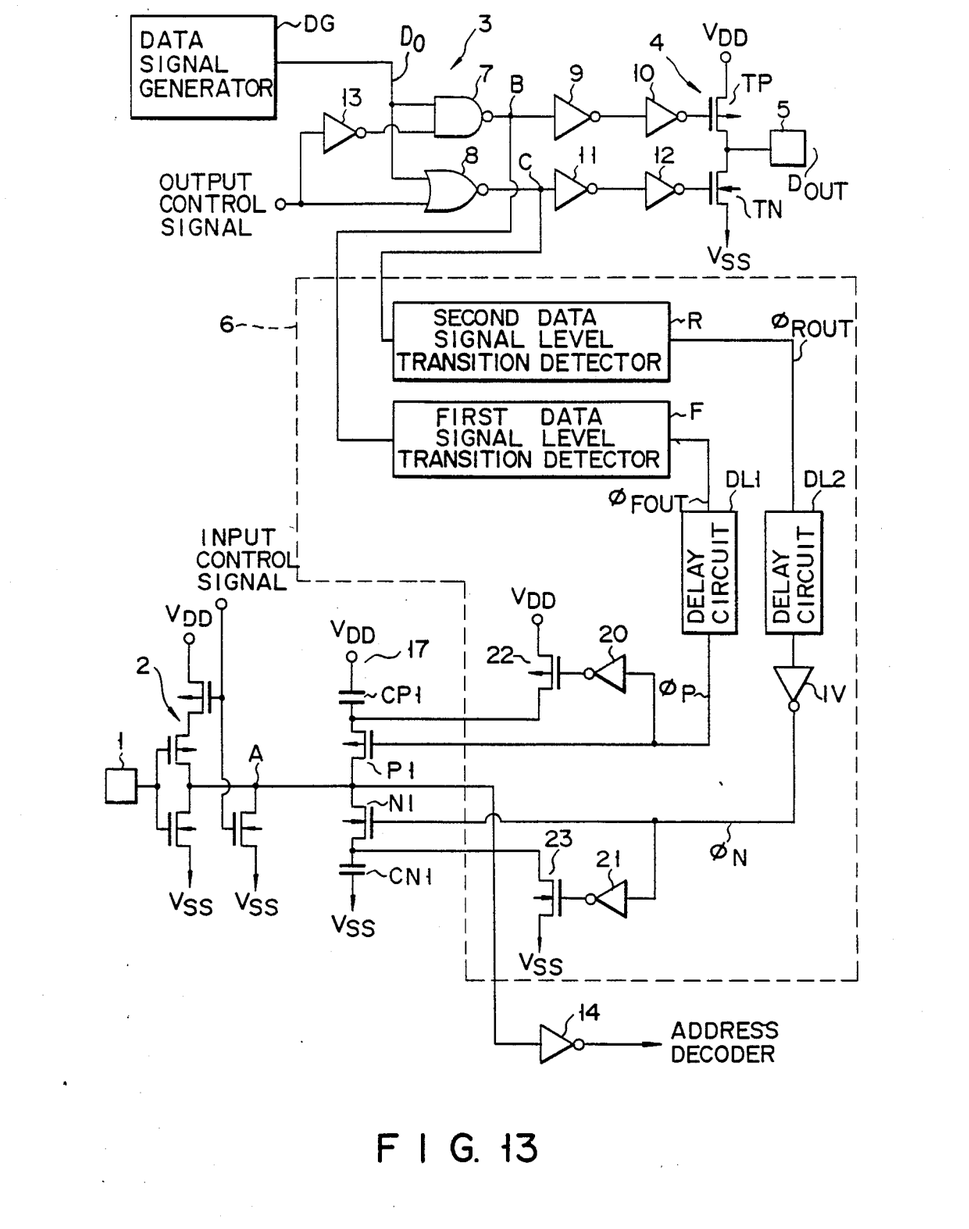
FIG. 13 shows a semiconductor device according to another embodiment of the present invention, including an input buffer operation error preventing circuit.

FIG. 13 shows another embodiment of the present invention. In this embodiment, a transistor 22 is connected across a junction between a capacitor CP1 and a transistor P1 and a power supply terminal $V_{DD}$ and a signal $\phi_P$ is coupled from a delay circuit DL1 via an inverter 20 to the gate of the transistor 22, and an N channel transistor 23 is connected across a junction between a capacitor CN1 and a transistor N1 and a ground potential $V_{SS}$. A signal $\phi_N$ is coupled from an inverter IV to the gate of the transistor 23 via an inverter 21.

A signal variation detection node of an output control circuit 3 may be located at any proper places in place of points B and C. For example, a rise variation on the output node of an inverter 9 and fall variation on an inverter 11 may be detected.

In the respective embodiments, the rise variation and fall variation of the output data are detected, thereby preventing a fall on the detection margin of the corresponding input signal. As the case may be, however, the capacitor CP1 and/or CP2 or capacitors CN1 and/or CN2 may be added only on the power supply terminal side or the ground terminal side. In this case, only the rise variation of the output data or only the fall variation may be detected, thereby preventing a fall in the detection margin of the input signal.

Furthermore, the semiconductor integrated circuit including an input buffer operation error preventing circuit can generally be applied to a semiconductor integrated circuit including input and output buffers.

What is claimed is:

1. A semiconductor integrated circuit including an input buffer operation error preventing circuit, comprising:
   a data signal generator for generating a first or a second logic level data output signal;
   an output control circuit means, including first and second current paths for first and second current path signals having first or second logic levels, for receiving the logic level data output signal from the data signal generator, for generating said first and second current path signals from the logic level data output signal and for generating an output control signal having a first or a second logic level from each current path signal;

an output buffer, connected across first and second potential supply means and, for receiving the output control signals from the output control circuit means and for generating a first or a second voltage level output buffer signal in accordance with the logic levels of the output control signals;

an input buffer, connected across the first potential supply means and the second potential supply means, for receiving an input signal of a predetermined level;

data output signal level transition detector means for detecting at least one of a transition of the output buffer signal from said first voltage level to said second voltage level and a transition of the output buffer signal from said second voltage level to said first voltage level by detecting at least one of a transition of one of said current path signals from the first logic level to the second logic level and a transition of one of said current path signals from the second logic level to the first logic level and for generating at least a first or a second detection signal; and input buffer signal terminal control means, responsive to the first or the second detection signals, for controlling the input buffer so as to cancel a fall in the level detection margin of the input signal of the input buffer caused by a potential variation of the first or second potential supply means resulting from a transition of the output buffer signal from the first voltage level to the second voltage level or from the second voltage level to the first voltage level, said input buffer signal terminal control means including capacitive means for preventing steep potential variations in an output of the input buffer.

2. The semiconductor integrated circuit according to claim 1, wherein said data output signal level transition detector means detects a transition of one of said current path signals from a first logic level to a second logic level or from the second logic level to the first logic level prior to a transition of said output buffer signal from said first level to said second level or from the second level to the first level and generates said first or second detection signal.

3. The semiconductor integrated circuit according to claim 1, wherein said input buffer signal terminal control means comprises a first transistor of a first channel type, a second transistor of a second channel type and said capacitive means, including a first capacitor and a second capacitor, connected across said first potential supply means and said second potential supply means, and said first and second transistors are controlled by said first and second detection signals respectively so that, during a period of time in which the first and second detection signals are output at a time of a transition of the current path signal from a first logic level to a second logic level or from the second logic level to the first logic level, an output terminal voltage of said input buffer is varied so as to cancel a fall in an input signal level detection margin of said input buffer which is caused due to a potential change of said first potential supply means or said second potential supply means.

4. The semiconductor integrated circuit according to claim 1, wherein said input buffer signal terminal control means comprises:
a first input buffer signal terminal control circuit, connected across said first potential supply means and said second potential supply means, for controlling a voltage on an output terminal of said input buffer; and
a second input buffer signal terminal control circuit, connected across said first potential supply means and said second potential supply means, for controlling a voltage on an input terminal of said input buffer.

5. The semiconductor integrated circuit according to claim 1, wherein said first and second detection signals are clock pulses.

6. The semiconductor integrated circuit according to claim 2, wherein said first and second detection signals are clock pulses.

7. The semiconductor integrated circuit according to claim 2, wherein said data output signal level transition detector means comprises a first data signal level transition detector for detecting a transition of one of said current path signals from a first logic level to a second logic level and for generating said first detection signal, first delay circuit, a second data signal level transition detector for detecting a transition of the other of said current path signals from the second logic level to the first logic level and for generating a second detection signal, second delay circuit and first inverter.

8. The semiconductor integrated circuit according to claim 7, wherein said first data signal level transition detector comprises:
a second inverter,
a third delay circuit,
a first NOR gate having two input terminals and an output terminal which receives said current path signal at a first input terminal and said current path signal at the second input terminal via a series circuit of said second inverter and said third delay circuit, and
a third inverter connected to said output terminal of said NOR gate.

9. The semiconductor integrated circuit according to claim 7, wherein said first data signal level transition detector comprises:
a second inverter,
a third delay circuit, and
a first NAND gate having two input terminals which receives said current path signal at one of said input terminals via said second inverter and said current path signal at the other of said input terminal via said third delay circuit.

10. The semiconductor integrated circuit according to claim 7, wherein said second data signal level transition detector comprises:
a second inverter,
a third delay circuit,
a NOR gate having two input terminals and an output terminal which receives said current path signal at one of said input terminals via the second inverter and said current path signal at the other of said input terminals via the third delay circuit, and
a third inverter connected to said output terminal of said NOR gate.

11. The semiconductor integrated circuit according to claim 7, wherein said second data signal level transition detector comprises:

a second inverter,
a third delay circuit,
a NAND gate having two input terminals and an output terminal which receives said current path signal directly at one of said input terminals and said current path signal at the other of said input terminals via a series circuit of said second inverter and said third delay circuit.

12. The semiconductor integrated circuit according to claim 8, wherein said third delay circuit comprises a plurality of series-connected inverters.

13. The semiconductor integrated circuit according to claim 9, wherein said third delay circuit comprises a plurality of series-connected inverters.

14. The semiconductor integrated circuit according to claim 10, wherein said third delay circuit comprises a plurality of series-connected inverters.

15. The semiconductor integrated circuit according to claim 11, wherein said third delay circuit comprises a plurality of series-connected inverters.

16. The semiconductor integrated circuit according to claim 3, wherein an additional current path is provided between said first transistor and said second transistor and connected to an output terminal of said input buffer.

17. The semiconductor integrated circuit according to claim 3, wherein an additional current path is provided between said first transistor and said second transistor and connected to an input terminal of said input buffer.

18. The semiconductor integrated circuit according to claim 4, wherein said first input buffer terminal voltage control circuit comprises a series circuit of a first capacitor and a first transistor of a first channel type and a second transistor of a second channel type and second capacitor, and an additional current path is provided between said first and second transistors and connected to an output terminal of said input buffer.

19. The semiconductor integrated circuit according to claim 4, wherein said second input buffer terminal control circuit comprises a series circuit of a third capacitor and a third transistor of a first channel type and a fourth transistor of a second channel type and fourth capacitor, a current path between the third transistor and the fourth transistor being connected to an input terminal of said input buffer.

* * * * *